United States Patent [19]

Nii

[11] Patent Number: 5,341,000

[45] Date of Patent: Aug. 23, 1994

[54] THIN SILICON CARBIDE LAYER ON AN INSULATING LAYER

[75] Inventor: Keita Nii, Kyoto, Japan

[73] Assignee: Rohm Co., Ltd., Kyoto, Japan

[21] Appl. No.: 829,200

[22] Filed: Feb. 3, 1992

[30] Foreign Application Priority Data

Sep. 18, 1991 [JP] Japan ................... 3-237882

[51] Int. Cl.$^5$ .............. H01L 31/0312; H01L 29; H01L 12; H01L 29; H01L 06; H01L 29; H01L 04

[52] U.S. Cl. .................... 257/77; 257/613; 257/623; 257/627

[58] Field of Search ............ 257/77, 76, 623, 627, 257/613; 437/83, 100

[56] References Cited

U.S. PATENT DOCUMENTS

| 4,874,718 | 10/1989 | Inoue | 437/83 |
| 4,983,538 | 1/1991 | Gotou | 437/100 |
| 4,997,787 | 3/1991 | Eshita | 437/100 |

FOREIGN PATENT DOCUMENTS

| 0399241 | 11/1990 | European Pat. Off. | 437/100 |
| 62-216219 | 9/1987 | Japan | 437/100 |
| 2-172894 | 7/1990 | Japan | 437/100 |
| 2-304937 | 12/1990 | Japan | 437/200 |

Primary Examiner—William Mintel
Assistant Examiner—Steven Loke
Attorney, Agent, or Firm—Lowe, Price, LeBlanc & Becker

[57] ABSTRACT

A present invention is intended to provide a semiconductor device having a structure in which devices are formed in a thin layer (18) of silicon carbide having reduced crystal faults on a silicon substrate (2). A silicon dioxide layer (4) is formed on the semiconductor substrate (2) (FIG. 2A). The silicon dioxide layer (4) is then provided with openings (14) (FIG. 2D). Silicon carbide is grown from the openings until it covers the insulating layer to thereby form a silicon carbide crystal layer (16) (FIG. 3A). The silicon carbide crystal layer (16) is then covered by a SOG layer 20 over the whole surface and subjected to anisotropic etching, whereby a thin layer of silicon carbide is left on the substrate (2) (FIG. 3C). Semiconductor circuit devices are formed in this thin layer (18). Since the layer (18) is grown laterally and has almost uniform plane orientation, it can provide a semiconductor device formed therein with superior electrical characteristics.

9 Claims, 4 Drawing Sheets

THIN SILICON CARBIDE LAYER ON AN INSULATING LAYER

BACKGROUND OF THE INVENTION

1. Field of the Invention

The present invention relates to methods for manufacturing semiconductor devices and, more particularly, to a method for manufacturing a thin layer of silicon carbide having a high degree of crystallinity with reduced crystal faults on a silicon substrate.

2. Description of the Prior Art

Epitaxial growth carried out on a silicon substrate is a technique used to obtain a silicon carbide crystal layer. The silicon carbide crystal layer obtained in this way is then used to form semiconductor devices therein. A manufacturing method for such a semiconductor device is described below.

First, a thin layer of a silicon substrate 2 is provided. Then the temperature of silicon substrate 2 is increased to the approximate range of 1100° C. to 1200° C. The silicon substrate is placed in a mixture consisting of hydrogen gas serving as carrier gas and a few percent of a source gas (for example, $SiH_4$, $SiH_6$ or $SiH_2CL_6$), whereby a silicon carbide crystal layer 3 is epitaxially grown on the silicon substrate 2, as shown in FIG. 1. Changing the concentration of the source gas serves to control thickness of the silicon carbide crystal layer 3. The silicon carbide crystal layer 3 thus obtained is used to form semiconductor devices (not shown) therein.

However, the conventional technique described above suffers from certain drawbacks. It is by heteroepitaxial growth that the silicon carbide crystal layer 3 is formed onto the silicon substrate 2. Consequently, there are differences between the silicon substrate 2 and the silicon carbide crystal layer 3 with regard to the lattice constant, the thermal expansion coefficient and chemical binding. As a result, the silicon carbide crystal layer 3 formed thereby has crystal faults, above all, stacking faults. These faults deteriorate the electrical characteristics of circuit devices formed in the silicon carbide crystal layer 3 and cause problems for its application as a semiconductor circuit.

SUMMARY OF THE INVENTION

An object of the present invention is to overcome the aforementioned problems and provide a method for growing a silicon carbide crystal layer having reduced crystal faults.

Another object of the present invention is to form semiconductor circuit devices having uniform, superior electrical characteristics in a silicon carbide crystal layer.

A method for manufacturing a semiconductor device according to the present invention includes:
 a step of forming an insulating layer from a material having a high melting point on a silicon substrate;
 forming an opening for crystal growth;
 effecting crystal growth until a silicon carbide crystal layer covers the insulating layer;
 forming a thin layer of silicon carbide by subjecting the silicon carbide crystal layer to etching; and
 forming a semiconductor device in the thin layer of silicon carbide.

Another aspect of the invention is a semiconductor device formed using the above-mentioned process.

While the novel features of the invention are set forth in a general fashion, particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1:
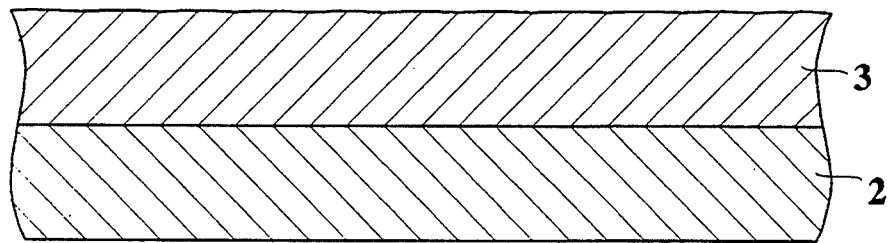
FIG. 1 is a diagram illustrating a conventional method for manufacturing a semiconductor device.
Figure 2A:
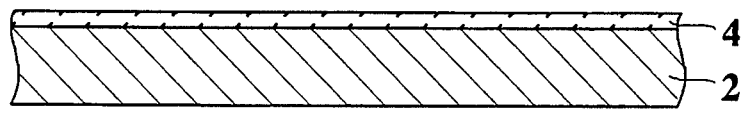
FIGS. 2A-2E are diagrams illustrating a method for manufacturing a semiconductor device according to an embodiment of the present invention.
Figure 2B:
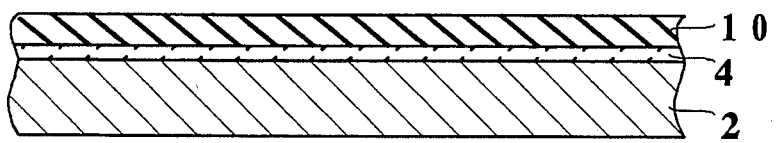
Figure 2C:
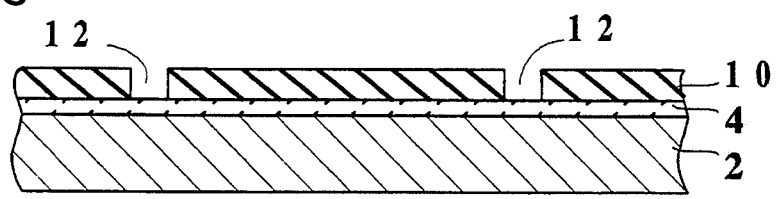
Figure 2D:

A method for manufacturing a semiconductor device according to a first embodiment of the present invention is shown in FIGS. 2A-2E and 3A-3C. First, a silicon substrate 2 is placed in an oxygen atmosphere with increased temperature, thereby thermally oxidizing the substrate surface. As a result, a silicon dioxide layer 4 ($SiO_2$) having a high melting point and serving as an insulating layer is formed on the top of the silicon substrate 2, as shown in FIG. 2A. Preferably, the silicon dioxide layer 4 is formed so as to be thin, for a example, approximately 30 run to 300 run thick. Next, as shown in FIG. 2B, photoresist 10 is applied onto the silicon dioxide layer 4. After a mask is placed on the photoresist 10 and exposed to ultraviolet rays, openings 12 are formed as shown in FIG. 2C. In this state, with the photoresist 10 used as a mask, the silicon dioxide layer 4 is subjected to etching. Subsequently, the photoresist 10 is removed by use of hydrogen fluoride. Thus, openings 14 for crystal growth are formed, as shown in FIG. 2D. The width of the openings 14 is less than 2 $\mu m$.

In the state shown in FIG. 2D, exposed substrate surfaces within openings 14 are subjected to carbonization. This treatment serves to prevent lattice inconsistency from occurring between the silicon substrate 2 and a silicon carbide crystal layer 16 (3C-SiC) grown at the next step. This is because a buffer layer is provided on the substrate surface by carbonization.

Figure 2E:
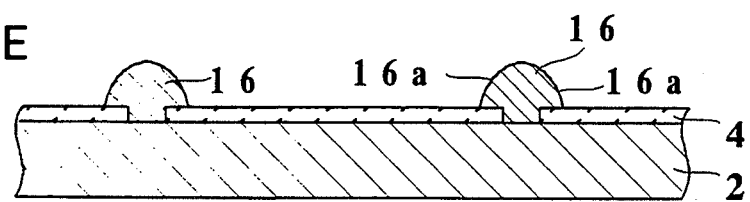

The openings 14 are then selectively subjected to epitaxial growth, whereby the silicon carbide crystal layer 16 is grown in the longitudinal direction, as shown in FIG. 2E. As the growth continues, the crystal layer 16 also spreads in the lateral direction on the silicon dioxide layer 4. At this step, in order to enable the laterally grown layer to have a uniform crystalline structure, it is necessary to give better crystallinity to a side face 16a of the silicon carbide layer grown in the longitudinal direction. For that purpose, the following conditions need to be considered. The silicon dioxide layer 4 is formed thin so as to decrease interface area, thereby enabling stacking faults to be suppressed. This is because stacking faults are most likely to be generated in the opening of the silicon dioxide layer 4. Further, the epitaxial growth is preferably carried out at as low a temperature as possible, within the approximate range of 1100° C. to 1200° C.; epitaxial growth carried out at such a low temperature will enable stacking faults to be suppressed. Moreover, when the silicon dioxide layer 4 is formed to a silicon substrate in a rectangular pattern with a crystal orientation of <100>, stacking faults can be further suppressed. And still further, prior to the epitaxial growth, addition of a thin polystltcon layer or a silicon nitride layer to a sidewall of the silicon dioxide layer 4 in openings 14 permits the lattice consistency to be improved, so that the crystal faults can be also suppressed.

Figure 3A:
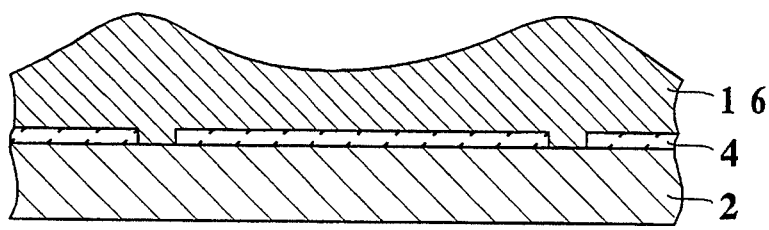
FIGS. 3A-3C are diagrams illustrating a method for manufacturing a semiconductor device according to another embodiment of the present invention.
Figure 3B:
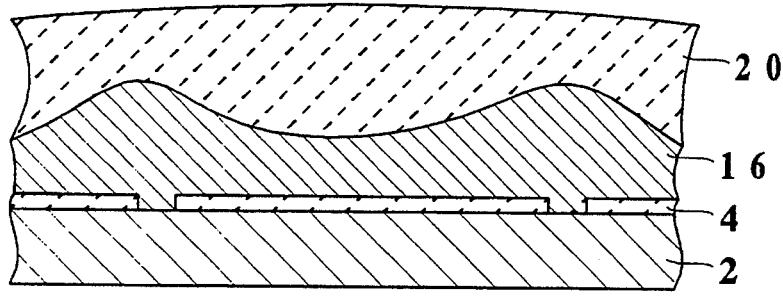
Figure 3C:
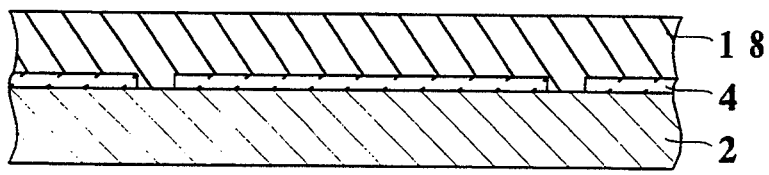

Each silicon carbide crystal layer 16, which is formed by the longitudinal growth from the opening 14, includes the side face 16a having the same plane orientation. Moreover, each silicon carbide crystal layer 16 laterally grows on the silicon dioxide layer 4 extending from the side face 16a, until it connects to one another silicon carbide crystal layer. Accordingly, the entire crystal layer 16 over the substrate has almost uniform plane orientation. The silicon carbide crystal layer 16 thus obtained has the structure shown in FIG. 3A. The crystal layer 16 shown in FIG. 3A is then applied by SOG (Spin on Glass) 20 onto the whole surface (FIG. 3B), and thereafter, subjected to anisotropic etching, whereby a thin layer of silicon carbide 18 is left as shown in FIG. 3C. Finally, a circuit device (not shown) is created in the thin silicon carbide layer 18.

The thin layer 18 of silicon carbide is insulated from the silicon substrate 2 by the silicon dioxide layer 4 except for the openings. Accordingly, it generates little electrostatic capacitance due to the pn junction with the silicon substrate 2. This means that the formation of circuit devices (e.g. transistors, FETs) in each thin layer 18 of silicon carbide will not cause any reduction in operating speed due to electrostatic capacitance, allowing a high-speed device to be realized. In addition, the plane orientation of the thin layer 18 is almost uniform and therefore the oxidation rate is also uniform, facilitating the control of device characteristics when forming devices in the thin layer 18.

Figure 4:
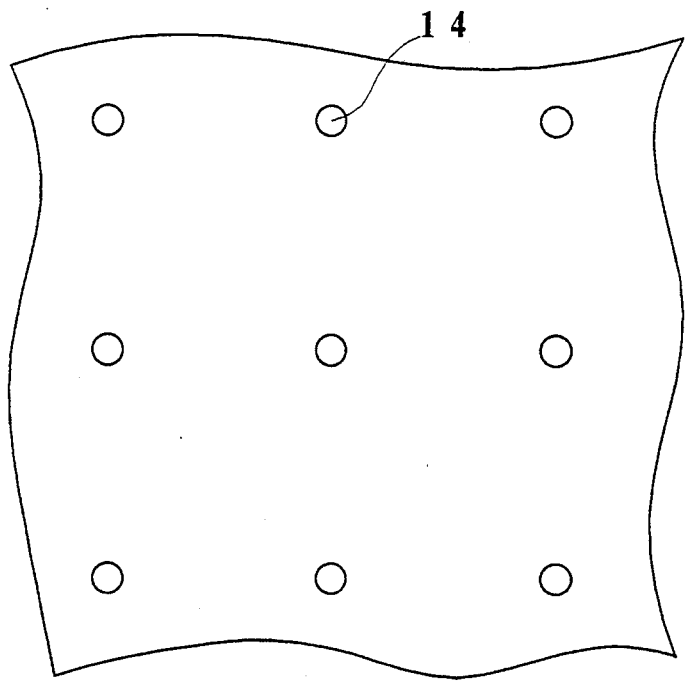
FIG. 4 is a diagram illustrating an opening pattern provide the oxide insulating layer 4 shown in FIG. 2D.
Figure 5:
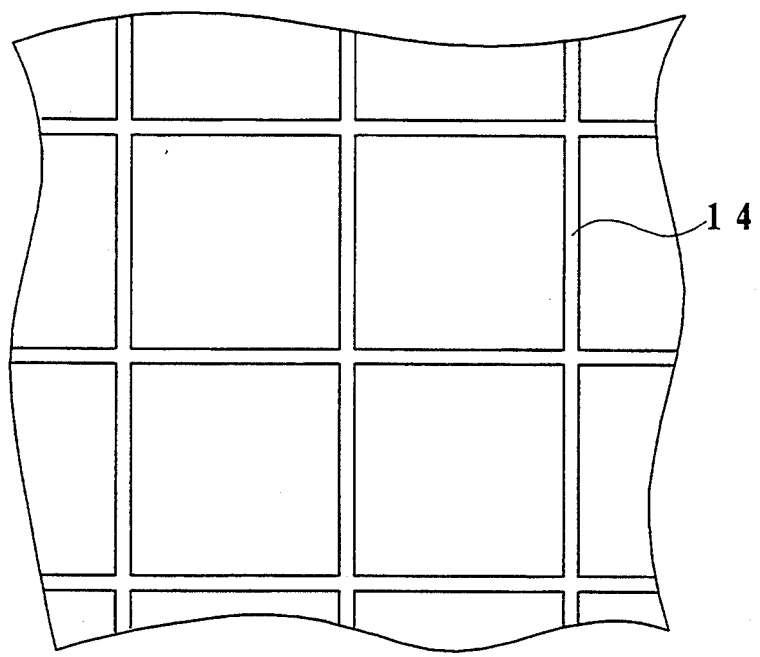
FIG. 5 is a diagram illustrating another opening pattern provided in the oxide insulating layer 4 shown in FIG. 2D.

The form of the openings 14 may be selected as appropriate to the required thin layer 18 of silicon carbide. For example, they may be in the form of holes as shown in FIG. 4, or in lattice-like pattern of channels as shown in FIG. 5. It may further be preferable that the direction of patterning the silicon dioxide layer 4 be <100>, which can prevent the occurrence of all faults.

In the method for manufacturing semiconductor device of the present invention, the insulating layer formed on the silicon substrate is provided with openings, so that the silicon carbide crystal layer grown therefrom are allowed to spread further in the lateral direction on the insulating layer, whereby the laterally grown silicon carbine crystal layer having almost uniform plane orientation is obtained.

Accordingly, a semiconductor device having superior electrical characteristics will be realized by forming devices in the laterally grown silicon carbine crystal layer.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A semiconductor device manufactured by a method which comprises the steps of:
    (a) forming an insulating layer from a material having a high melting point on a silicon substrate;
    (b) providing said insulating layer with an opening for crystal growth;
    (c) effecting crystal growth until a silicon carbine crystal layer covers said insulating layer;
    (d) forming a thin layer of silicon carbide by subjecting said silicon carbide crystal layer to etching; and
    (e) forming a semiconductor device in said thin layer of silicon carbide.

2. The semiconductor device of claim 1, wherein said insulating layer is a silicon dioxide layer.

3. A semiconductor device manufactured by a method comprising the steps of:
    (a) forming an insulating layer having a high melting point on a silicon substrate;
    (b) forming a plurality of openings in said insulating layer to expose said silicon substrate;
    (c) subjecting said plurality of openings to epitaxial crystal growth whereby a silicon carbide crystal layer is formed which covers said insulating layer;
    (d) forming a thin layer of silicon carbide from said carbide crystal layer; and
    (e) forming a semiconductor circuit device in said thin layer of silicon carbide.

4. The semiconductor device of claim 3, wherein said plurality of openings in said insulating layer comprise a plurality of substantially circular holes.

5. The semiconductor device of claim 4, wherein said holes are less than 2 $\mu$m in diameter.

6. The semiconductor device of claim 3, wherein said plurality of openings in said insulating layer comprise a lattice-like pattern of channels.

7. The semiconductor device of claim 3, wherein said insulating layer is formed to a thickness of between 30 nm to 300 nm.

8. The semiconductor device of claim 3, wherein said thin layer of silicon carbide is formed to have a substantially flat upper surface.

9. A semiconductor device manufactured by a method which comprises the steps of:
    (a) forming an insulating layer having a high melting point on a silicon substrate;
    (b) forming a plurality of openings in said insulating layer to expose said silicon substrate, said plurality of openings being provided with sidewall linings formed of a material selected from the group consisting of polysilicon and silicon nitride;
    (c) subjecting said plurality of openings to epitaxial crystal growth whereby a silicon carbide crystal layer covers said insulating layer;
    (d) forming a thin layer of silicon carbide from said silicon carbide crystal layer; and
    (e) forming a semiconductor circuit device in said thin layer of silicon carbide.

* * * * *